United States Patent [19]
Amerasekera

[11] Patent Number: 5,949,094
[45] Date of Patent: Sep. 7, 1999

[54] ESD PROTECTION FOR HIGH DENSITY DRAMS USING TRIPLE-WELL TECHNOLOGY

[75] Inventor: E. Ajith Amerasekera, Plano, Tex.

[73] Assignee: Texas Instruments Incorporated, Dallas, Tex.

[21] Appl. No.: 08/920,998

[22] Filed: Aug. 29, 1997

[51] Int. Cl.⁶ .......................... H01L 29/74; H01L 31/111; H01L 29/76; H01L 29/94

[52] U.S. Cl. ............................ 257/173; 257/174; 257/366

[58] Field of Search ..................................... 257/173, 174, 257/362

[56] References Cited

U.S. PATENT DOCUMENTS

| | | |
|---|---|---|
| 4,595,941 | 6/1986 | Avery . |
| 4,631,567 | 12/1986 | Kokado et al. . |
| 4,633,283 | 12/1986 | Avery . |
| 4,943,835 | 7/1990 | Yakushiji et al. . |
| 5,001,537 | 3/1991 | Colman et al. . |
| 5,440,151 | 8/1995 | Crevel et al. ............................ 257/173 |
| 5,485,024 | 1/1996 | Reay ........................................ 257/173 |
| 5,663,860 | 9/1997 | Swonger .................................... 361/56 |
| 5,808,342 | 9/1998 | Chen et al. ............................. 257/357 |

*Primary Examiner*—Ngân V. Ngô
*Attorney, Agent, or Firm*—Wade James Brady, III; Richard L. Donaldson

[57] ABSTRACT

An ESD protected semiconductor circuit and the ESD protection circuit. The protected circuit includes a terminal, a semiconductor device coupled to the terminal and an ESD protection circuit. The ESD protection circuit includes a substrate of a first conductivity type and has a surface. A first well of conductivity type opposite to the first conductivity type is disposed within the substrate and extends to the surface. A second well of the first conductivity type is disposed within the first well and is spaced from the substrate and extending to the surface. A third region of the opposite conductivity type is disposed within the second well and is spaced from the first well and extending to the surface. At least one of the substrate or the third region is coupled to the terminal.

12 Claims, 1 Drawing Sheet

ESD PROTECTION FOR HIGH DENSITY DRAMS USING TRIPLE-WELL TECHNOLOGY

CROSS REFERENCE TO RELATED APPLICATIONS

This application is related to Ser. No. 08/302,145, filed Sep. 7, 1994 (TI-18616), the contents of which are incorporated herein by reference.

BACKGROUND OF THE INVENTION

1. Field of the Invention

This invention relates to integrated circuits and, more specifically, to ESD protection for integrated circuits.

2. Brief Description of the Prior Art

Electrostatic discharge (ESD) may cause damage to semiconductor devices in an integrated circuit during handling of the integrated circuit chip package, this being particularly true in the case of MOS circuitry including DRAMs. It is therefore necessary to protect such circuits against damage due to stress conditions such as high energy, high voltage and/or high current pulses. Prevention of such damage generally is provided by protection circuits incorporated into the chip of the integrated circuit. In general, such protection circuits present high impedance or an open circuit therefrom during normal operating conditions of the integrated circuit and switch to low impedance under the above described stress conditions. Such protection circuits generally include a switch which is capable of conducting relatively large currents during an ESD event. Various devices such as silicon controlled rectifiers (SCRs), which are PNPN-type devices, can be and have been utilized to provide the switching function required to essentially shunt the protected circuitry during an ESD event and such prior art devices and a standard manner of fabrication thereof is set forth in the above noted Ser. No. 08/302,145.

Prior art circuits and structures used for ESD protection can withstand high levels of ESD stress. However, recent advances in technology have produced devices with increasingly smaller geometry. This smaller geometry results in devices which can fail at voltage levels lower than the triggering voltages of prior art protection circuits. Accordingly, improved ESD protection has been sought, one such ESD protection circuit being set forth in the above noted application Ser. No. 08/302,145.

SUMMARY OF THE INVENTION

In accordance with the present invention, there is provided an arrangement for ESD protection which overcomes the above noted problems using minimum area and providing maximized protection levels.

Briefly, the above is accomplished by providing a triple well to form vertical bipolar/SCR structures in a CMOS process. The vertical structures allow better power dissipation and higher ESD levels than do lateral structures. The triple well is formed in a doped substrate using the techniques of the prior art for formation of wells in a substrate and/or within another well. Each successive well is of opposite conductivity type from the substrate or the well in which it is formed and each of the wells as well as the substrate has a region extending to a single upper surface of the device being fabricated. The substrate can be n-type or p-type with the formed wells then being alternately of conductivity type different from and then the same as the substrate. The last well or region formed can be more highly doped to avoid the step of forming a highly doped contact region therein. The result is a vertical PNPN structure which also has access to all of the regions from the top surface.

DESCRIPTION OF THE PREFERRED EMBODIMENT

Figure 1A:
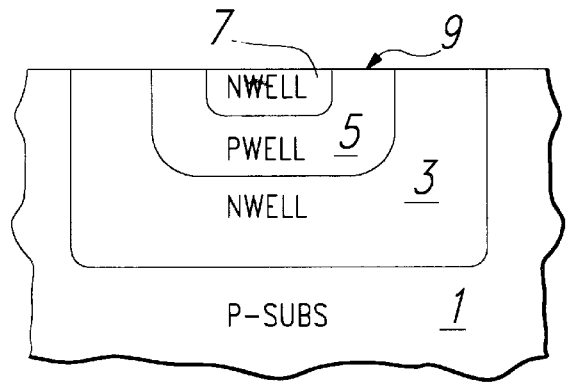
FIG. 1a is a cross-sectional view of a partially fabricated PNPN SCR structure having ESD protection.

Referring to FIG. 1a, there is shown a starting structure which is fabricated by standard patterning and doping and includes a p-type substrate 1 having a first n-type well 3 therein. A p-type well 5 is formed within the first n-well 3 and a second n-type well or region 7 is formed within the p-well 5. All of the wells 3, 5 and 7 extend to the upper surface 9 of the substrate 1 and a portion of the substrate is also exposed at the upper surface. It should be understood that an equivalent device can be made starting with an n-type substrate with the conductivity types of the wells being reversed and such embodiment is also contemplated in accordance with the present invention.

Figure 1B:
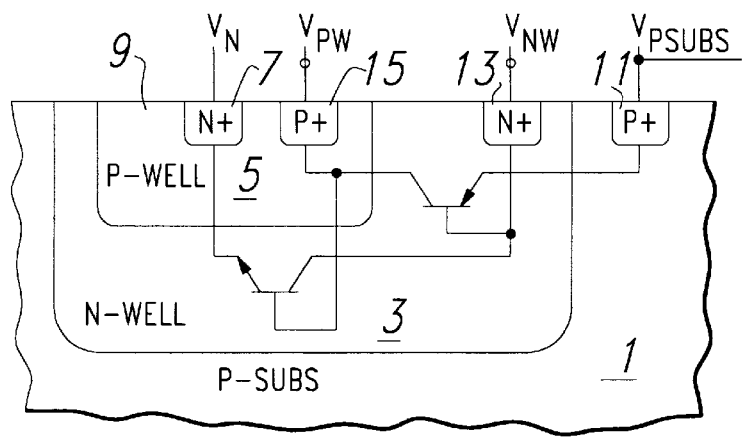
FIG. 1b is a view as in FIG. 1a of a completed SCR structure in accordance with the present invention.
Figure 1C:
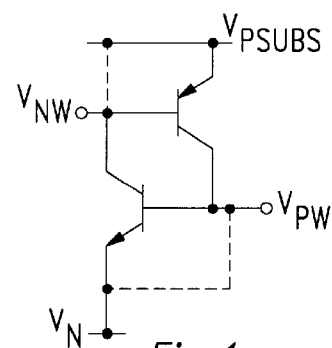
FIG. 1c is a schematic diagram of the circuit of FIG. 1b.

Referring now to FIGS. 1(b) and 1(c), a p+ contact region 11 is formed at the surface 9 of the substrate 1, an n+ contact region 13 is formed at the surface 9 of the n-well 3 and a p+ contact region 15 is formed at the surface 9 of the p-well 5, the n-well or region 7 having been initially doped to n+ level by appropriate standard masking and doping. Pads and/or leads are provided to the contact regions in standard manner, there being a $V_N$ lead 17 to the n-well, a $V_{PW}$ lead 19 to the contact 15, a $V_{NW}$ lead 21 to the contact 13 and a $V_{SUBS}$ lead 23 to the contact 11. It can be seen that two bipolar transistors have been formed, one such transistor being an NPN transistor including regions 3, 5 and 7 and the other such transistor being a PNP transistor including regions 1, 3 and 5. The common regions 3 and 5 result in the final PNPN SCR structure To turn the SCR of FIG. 1b on, it is necessary to forward bias any of the junctions such as the junction between the n-well 3 and the substrate 1, the junction between the p-well 5 and the n-well 3 or the junction between the p-well 5 and the n-well or region 7. The requirement for SCR conduction is to first turn on the PNP transistor portion of the SCR, this including the substrate 1, the n-well 3 and the p-well 5 or the NPN transistor portion of the SCR, this including the n-well 3, the p-well 5 and the second n-well or region 7. Turn-on is accomplished by raising the voltage at terminal 23 above the voltage of the n-well 3 or by lowering the voltage at terminal 17 below that at the p-well 5, thereby injecting current into the base of either the PNP transistor or the NPN transistor. The turn-on voltage is very low relative to the prior art SCR ESD protection circuits because the turn-on voltage is merely the voltage between terminal 23 and the n-well 3 or between terminal 17 and the p-well 5.

Figure 2:
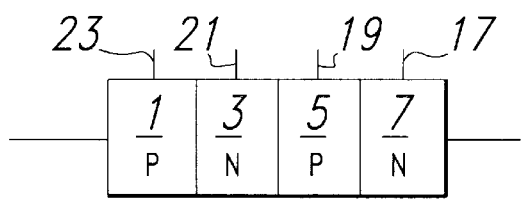
FIG. 2 is a schematic diagram of the completed device of FIG. 1b.

The final structure, as shown in FIG. 2, from an electrical perspective, is a PNPN device with leads available from each of the regions 1, 3, 5 and 7.

Figure 3:
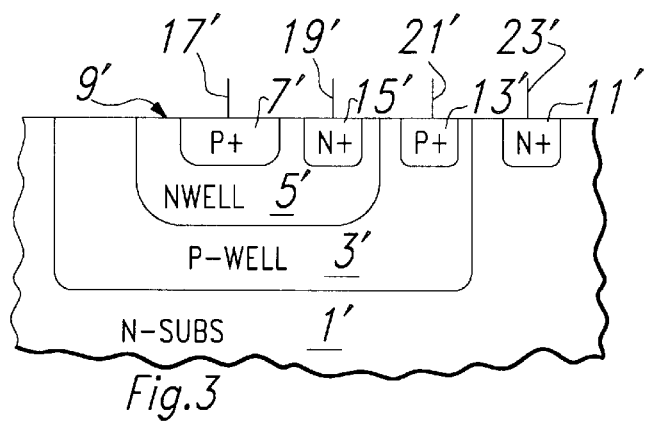
FIG. 3 is a device as in FIG. 1b but with the n-type regions changed to p-type and the p-type regions changed to n-type.

Referring now to FIG. 3, there is shown a structure which is identical to that of FIG. 1b except that the p-type regions have been changed to n-type and the n-type regions have been changed to p-type and with all reference characters referring to the same structures as in FIG. 1b being the same except that they are primed (').

Figure 4A:
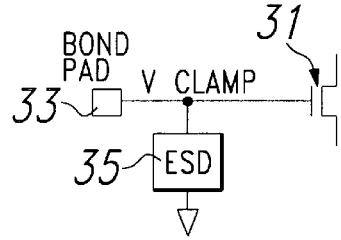
FIG. 4(a) is a schematic diagram showing the ESD protection circuit of the present invention used in conjunction with an MOS transistor for protection of the input transistor.

Referring now to FIG. 4(a), there is shown typical ESD protection of an MOS transistor 31 with an ESD protection circuit 35. The ESD protection circuit normally is off, thereby providing a very high impedance to ground. When the voltage at the bond pad 33 becomes excessive, the voltage thereon is applied to the ESD circuit 35 and specifically to the terminals 17,19 and 21,23 to turn on one of the PNP or NPN transistors and shunt the current around the MOS transistor 31, thereby avoiding damage to the MOS transistor.

Figure 4B:
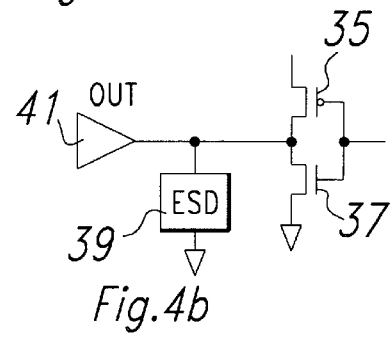
FIG. 4(b) is a schematic diagram showing the ESD protection circuit of the present invention used in conjunction with an MOS transistor for protection of the output transistor.

Referring now to FIG. 4(b), there is shown typical ESD protection of PMOS transistor 35 and NMOS transistor 37 (or both transistors can be NMOS) with an ESD protection circuit 39. The ESD protection circuit normally is off, thereby providing a very high impedance to ground. When the voltage at the bond pad 41 becomes excessive, the voltage thereon is applied to the ESD circuit 35 and specifically to the terminals 17,19 and 21, 23 to turn on one of the PNP or NPN transistors and shunt the current around the MOS transistors 35 and 37, thereby avoiding damage to the MOS transistors.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. An ESD protected semiconductor circuit which comprises:
   (a) a terminal;
   (b) a semiconductor device coupled to said terminal; and
   (c) a normally non-operational ESD protection circuit coupled to said terminal, said ESD protection circuit comprising a PNPN semiconductor device including
      (i) a semiconductor region of a first conductivity type having a surface;
      (ii) a first well of conductivity type opposite to said first conductivity type disposed within said region and extending to said surface;
      (iii) a second well of said first conductivity type disposed within said first well, spaced from said region and extending to said surface; and
      (iv) a third well of said opposite conductivity type disposed within said second well, spaced from said first well and said region and extending to said surface;
   (d) said normally non-operational ESD protection circuit being rendered operational under predetermined conditions to protect said semiconductor device; and
   (e) a separate contact region on said surface for each of said region and said first and second wells.

2. The circuit of claim 1 wherein said semiconductor device is an MOS transistor.

3. The circuit of claim 1 wherein said first conductivity type is p-type.

4. The circuit of claim 2 wherein said first conductivity type is p-type.

5. The circuit of claim 1 wherein said first conductivity type is n-type.

6. The circuit of claim 2 wherein said first conductivity type is n-type.

7. An ESD protection circuit comprising a PNPN semiconductor device including:
   (a) a semiconductor region of a first conductivity type having a surface;
   (b) a first well of conductivity type opposite to said first conductivity type disposed within said region and extending to said surface;
   (c) a second well of said first conductivity type disposed within said first well spaced from said region and extending to said surface;
   (d) a third well of said opposite conductivity type disposed within said second well and spaced from said first well and extending to said surface and
   a separate contact region on said surface for each of said semiconductor region and said first and second wells.

8. The circuit of claim 7 wherein said first conductivity type is p-type.

9. The circuit of claim 7 wherein said first conductivity type is n-type.

10. An ESD protection circuit which comprises a PNPN semiconductor device including:
    (a) a semiconductor region of a first conductivity type having a surface;
    (b) three wells disposed in said semiconductor region and extending to said surface, a first of said wells entirely within a second of said wells and the second of said wells entirely within the third of said wells, said third well disposed within said region, said second well being of said first conductivity type and said first and third wells being of opposite conductivity type; and
    (c) a separate contact region on said surface for each of said semiconductor region and said first and second wells.

11. The circuit of claim 10 wherein said first conductivity type is p-type.

12. The circuit of claim 10 wherein said first conductivity type is p-type.

* * * * *